US011984905B2

(12) United States Patent
Huang et al.

(10) Patent No.: US 11,984,905 B2
(45) Date of Patent: May 14, 2024

(54) HIGH-SPEED AND LOW-POWER SUCCESSIVE APPROXIMATION REGISTER ANALOG-TO-DIGITAL CONVERTER (SAR ADC) AND ANALOG-TO-DIGITAL CONVERSION METHOD

(71) Applicant: Anhui University, Hefei (CN)

(72) Inventors: Zhixiang Huang, Hefei (CN); Xueshi Hou, Hefei (CN); Zongming Duan, Hefei (CN); Bowen Wu, Hefei (CN); Jiecheng Zhao, Hefei (CN)

(73) Assignee: Anhui University, Hefel (CN)

(*) Notice: Subject to any disclaimer, the term of this patent is extended or adjusted under 35 U.S.C. 154(b) by 170 days.

(21) Appl. No.: 17/847,409

(22) Filed: Jun. 23, 2022

(65) Prior Publication Data

US 2023/0336184 A1   Oct. 19, 2023

(30) Foreign Application Priority Data

Apr. 13, 2022   (CN) .......................... 202210384574.8

(51) Int. Cl.
*H03M 1/10*   (2006.01)
(52) U.S. Cl.
CPC ................................ *H03M 1/1014* (2013.01)
(58) Field of Classification Search
CPC ...... H03M 1/002; H03M 1/10; H03M 1/1014; H03M 1/466; H03M 1/468; H03M 1/0692
See application file for complete search history.

(56) References Cited

U.S. PATENT DOCUMENTS

| 8,471,755 | B1* | 6/2013 | Figueiredo | H03M 1/468 |
| | | | | 341/172 |
| 9,319,059 | B1* | 4/2016 | Sharma | H03M 1/403 |
| 9,432,044 | B1* | 8/2016 | Lee | H03M 1/1061 |
| 10,491,233 | B1* | 11/2019 | Emira | H03M 1/466 |
| 10,673,455 | B2* | 6/2020 | Kulkarni | H03M 1/38 |
| 2010/0123611 | A1* | 5/2010 | Cho | H03M 1/069 |
| | | | | 341/156 |
| 2012/0256774 | A1* | 10/2012 | Dey | H03M 1/109 |
| | | | | 341/172 |
| 2012/0262316 | A1* | 10/2012 | Strode | H03M 1/162 |
| | | | | 341/110 |
| 2013/0076553 | A1* | 3/2013 | Kuo | H03M 1/466 |
| | | | | 341/172 |

(Continued)

*Primary Examiner* — Lam T Mai
(74) *Attorney, Agent, or Firm* — Reising Ethington P.C.

(57) ABSTRACT

The present disclosure relates to a high-speed and low-power successive approximation register analog-to-digital converter (SAR ADC) and an analog-to-digital conversion method. Binary redundancy reassembly is performed to improve a digital-to-analog converter (DAC) capacitor array included in the SAR ADC such that the total number of capacitors included in a capacitor sub-array of the DAC capacitor array is greater than the number of precision bits of the SAR ADC, and the total number of unit capacitors included in all capacitors when the total number of capacitors included in the capacitor sub-array is greater than the number of precision bits of the SAR ADC is equal to the total number of unit capacitors included in all capacitors when the total number of capacitors included in the capacitor sub-array is equal to the number of precision bits of the SAR ADC.

18 Claims, 5 Drawing Sheets

(56) References Cited

U.S. PATENT DOCUMENTS

| | | | |
|---|---|---|---|
| 2013/0076554 A1* | 3/2013 | Chu | H03M 1/14 |
| | | | 341/172 |
| 2015/0180498 A1* | 6/2015 | Yang | H03M 1/403 |
| | | | 341/161 |
| 2017/0033800 A1* | 2/2017 | Yuan | H03M 1/1245 |
| 2018/0269893 A1* | 9/2018 | Chang | H03M 1/0682 |
| 2019/0348994 A1* | 11/2019 | Kong | H03M 1/462 |
| 2023/0024276 A1* | 1/2023 | Lin | H03M 3/468 |

\* cited by examiner

| Weight | 2048 | 1024 | 512 | 256 | 128 | 64 | 32 | 16 | 8 | 4 | 2 | 1 |
|---|---|---|---|---|---|---|---|---|---|---|---|---|
|   |      | B12  | B12 | B12 | B12 |    | B9 |    |    |    |    |    |
| + |      | B11  | B10 | B9  | B8  | B7 | B8 | B7 |    |    |    |    |
|   |      |      |     |     |     |    | B6 | B6 |    |    |    |    |
|   |      |      |     |     |     |    | B5 | B4 | B3 | B2 | B1 | B0 |
| Binary code | D11 | D10 | D9 | D8 | D7 | D6 | D5 | D4 | D3 | D2 | D1 | D0 |

HIGH-SPEED AND LOW-POWER SUCCESSIVE APPROXIMATION REGISTER ANALOG-TO-DIGITAL CONVERTER (SAR ADC) AND ANALOG-TO-DIGITAL CONVERSION METHOD

CROSS REFERENCE TO RELATED APPLICATION

This patent application claims the benefit and priority of Chinese Patent Application No. 202210384574.8, filed on Apr. 13, 2022, the disclosure of which is incorporated by reference herein in its entirety as part of the present application.

TECHNICAL FIELD

The present disclosure relates to the technical field of information processing, and in particular, to a high-speed and low-power successive approximation register analog-to-digital converter (SAR ADC) and an analog-to-digital conversion method.

BACKGROUND ART

A SAR ADC is a medium-precision, medium-speed, and low-power analog-to-digital conversion circuit. Featuring a simple structure and low power consumption, the SAR ADC is widely used.

With the continuous progress of science and technology, people have increasingly high requirements for data processing speed, precision, and power consumption in the field of information processing, and research and design of a high-speed and low-power ADC are increasingly important. A maximum capacitance $C_{max}$ of a digital-to-analog converter (DAC) capacitor array of a traditional binary array-based SAR ADC increases exponentially with a quantity N of precision bits of the ADC, that is, $C_{max}=2^{N-1} \times C$, where C represents a unit capacitor. To achieve 12-bit precision, a total capacitance is as follows: $C_{total}=2^{12} \times C$. Therefore, if a traditional binary SAR architecture is used to implement a high-precision ADC, a large quantity of unit capacitors need to be used. It can be learned that when sampling precision is improved, a large quantity of unit capacitors are required, capacitance mismatch is serious, and it takes a long time to establish the DAC capacitor array. Consequently, power consumption is high, an area is large, there are a few effective bits, and a conversion rate is low. A large quantity of unit capacitors are usually required for a high-speed and high-precision SAR ADC, resulting in large charge and discharge currents of the capacitors, high power consumption of driving switches of the capacitors, a large chip area, and a high economic cost. Therefore, research and design of a high-speed and low-power SAR ADC is of great significance.

Main power consumption of the SAR ADC comes from a huge capacitor array, and speed and precision are also limited by the capacitor array. Therefore, a main research object of the high-speed and low-power SAR ADC is the DAC capacitor array. A traditional DAC capacitor array with a binary segmented structure can significantly reduce the total number of unit capacitors. However, a capacitance of a bridging capacitor Cs connecting segments is as follows: $Cs=(2^n/(2^n-1))C$, where n is the number of bits in the segment. A capacitance ratio of the bridging capacitor Cs and the unit capacitor C is a fraction, which is not easy to implement and accurately match in a layout, and is also sensitive to a parasitic capacitor of the layout. In practical designs, the unit capacitor C is usually used for substitution. In comparison with a binary weighted structure, although this structure can be better matched than a conventional structure, a denominator of a weight of the capacitor array with this structure is reduced by 1, that is, the weight is no longer binary weighted. Therefore, a fixed gain error is introduced. A smaller capacitance of the unit capacitor indicates a smaller capacitance of a unit bridging capacitor. As a result, other parasitic capacitors during implementation of the layout have a larger proportion, and precision of the ADC is also restricted. To achieve high precision, the capacitance of the unit capacitor is usually increased for the DAC capacitor array with the segmented structure.

In view of this, there is an urgent need in the field for a high-speed and low-power SAR ADC and an analog-to-digital conversion method.

SUMMARY

The present disclosure provides a high-speed and low-power SAR ADC and an analog-to-digital conversion method to achieve high speed and high precision at low power consumption, reduce a chip area, and improve economic benefits.

To achieve the foregoing objective, the present disclosure provides the following technical solutions.

A high-speed and low-power SAR ADC is provided. The SAR ADC includes a sample and hold circuit, a binarization circuit, and a digital error correction circuit.

The sample and hold circuit is configured to sample an input signal to obtain a sampled signal.

The binarization circuit is connected to an output terminal of the sample and hold circuit; the binarization circuit includes a DAC capacitor array, the DAC capacitor array includes two capacitor sub-arrays with a same structure, the capacitor sub-arrays each include a plurality of capacitors, a lower plate of each of the capacitors is selectively connected to a reference voltage, a ground, or the sampled signal through a multiplexer switch, and upper plates of all of the capacitors are connected to serve as an output terminal of the capacitor sub-array; and the total number of capacitors included in the capacitor sub-array is greater than the number of precision bits of the SAR ADC, and the total number of unit capacitors included in all of the capacitors when the total number of capacitors included in the capacitor sub-array is greater than the number of precision bits of the SAR ADC is equal to the total number of unit capacitors included in all of the capacitors when the total number of capacitors included in the capacitor sub-array is equal to the number of precision bits of the SAR ADC.

The binarization circuit is configured to binarize the sampled signal to obtain an initial binary code; and the number of bits of the initial binary code is equal to the total number of capacitors included in the capacitor sub-array.

The digital error correction circuit is connected to an output terminal of the binarization circuit; the digital error correction circuit is configured to convert the initial binary code to obtain a binary code; and the number of bits of the binary code is equal to the number of precision bits of the SAR ADC.

An analog-to-digital conversion method based on the foregoing high-speed and low-power SAR ADC is provided. The analog-to-digital conversion method includes:

using a sample and hold circuit to sample an input signal to obtain a sampled signal;

using a binarization circuit to binarize the sampled signal to output an initial binary code, where the number of bits of the initial binary code is equal to the total number of capacitors included in a capacitor sub-array; and using a digital error correction circuit to convert the initial binary code to obtain a binary code, where the number of bits of the binary code is equal to the number of precision bits of the SAR ADC.

Based on specific embodiments provided in the present disclosure, the present disclosure has the following technical effects.

The present disclosure provides the high-speed and low-power SAR ADC and analog-to-digital conversion method. The SAR ADC includes the sample and hold circuit, the binarization circuit, and the digital error correction circuit. The sample and hold circuit is used to sample the input signal to obtain the sampled signal. Then, the binarization circuit is used to binarize the sampled signal to output the initial binary code, where the number of bits of the initial binary code is equal to the total number of capacitors included in the capacitor sub-array. Finally, the digital error correction circuit is used to convert the initial binary code to obtain the binary code, where the number of bits of the binary code is equal to the number of precision bits of the SAR ADC. In the binarization circuit, the total number of capacitors included in the capacitor sub-array of the DAC capacitor array is greater than the number of precision bits of the SAR ADC. The total number of unit capacitors included in all of the capacitors when the total number of capacitors included in the capacitor sub-array is greater than the number of precision bits of the SAR ADC is equal to the total number of unit capacitors included in all of the capacitors when the total number of capacitors included in the capacitor sub-array is equal to the number of precision bits of the SAR ADC. Further, the DAC capacitor array is improved by using binary redundancy reassembly. The DAC capacitor array with a binary redundancy reassembly structure can introduce redundancy during the quantization and calibrate an error during the quantization without increasing the number of unit capacitors. This reduces overall quantization duration and improves quantization speed and precision. The SAR ADC with this architecture can achieve high speed and high precision at low power consumption, reduce a chip area, and improve economic benefits.

BRIEF DESCRIPTION OF THE DRAWINGS

To describe the technical solutions in the embodiments of the present disclosure or in the prior art more clearly, the accompanying drawings required for the embodiments are briefly described below. Apparently, the accompanying drawings in the following description show merely some embodiments of the present disclosure, and persons of ordinary skill in the art may still derive other accompanying drawings from these accompanying drawings without creative efforts.

REFERENCE NUMERALS

1: sample and hold circuit; 2: DAC capacitor array; 3: comparator; 4: SAR; and 5: digital error correction circuit.

DETAILED DESCRIPTION OF THE EMBODIMENTS

The technical solutions of the embodiments of the present disclosure are clearly and completely described below with reference to the accompanying drawings. Apparently, the described embodiments are merely a part rather than all of the embodiments of the present disclosure. All other embodiments obtained by those of ordinary skill in the art based on the embodiments of the present disclosure without creative efforts shall fall within the protection scope of the present disclosure.

The present disclosure provides a high-speed and low-power SAR ADC and an analog-to-digital conversion method to achieve high speed and high precision at low power consumption, reduce a chip area, and improve economic benefits.

To make the foregoing objective, features, and advantages of the present disclosure clearer and more comprehensible, the present disclosure will be further described in detail below with reference to the accompanying drawings and the specific embodiments.

Embodiment 1

Before the solution in this embodiment is described, technical terms involved are described.

Each capacitor in this embodiment is composed of a plurality of unit capacitors C and a corresponding multiplexer switch. A capacitance weight of the capacitor is the number of unit capacitors included in the capacitor. The number of unit capacitors included in the capacitor is a positive integer. An equivalent weight of the capacitor is a charge amount of the capacitor, and may also be referred to as a stride voltage. An equivalent weight of an $i^{th}$ capacitor is calculated as follows: si=VREFPi (a reference voltage corresponding to Ci)×wi (a capacitance weight of Ci). In other words, the equivalent weight of the capacitor is equal to a product of a reference voltage and the capacitance weight of the capacitor. When the reference voltage is constant, a proportional relationship between the equivalent weight and the capacitance weight of the capacitor is constant.

Figure 1:
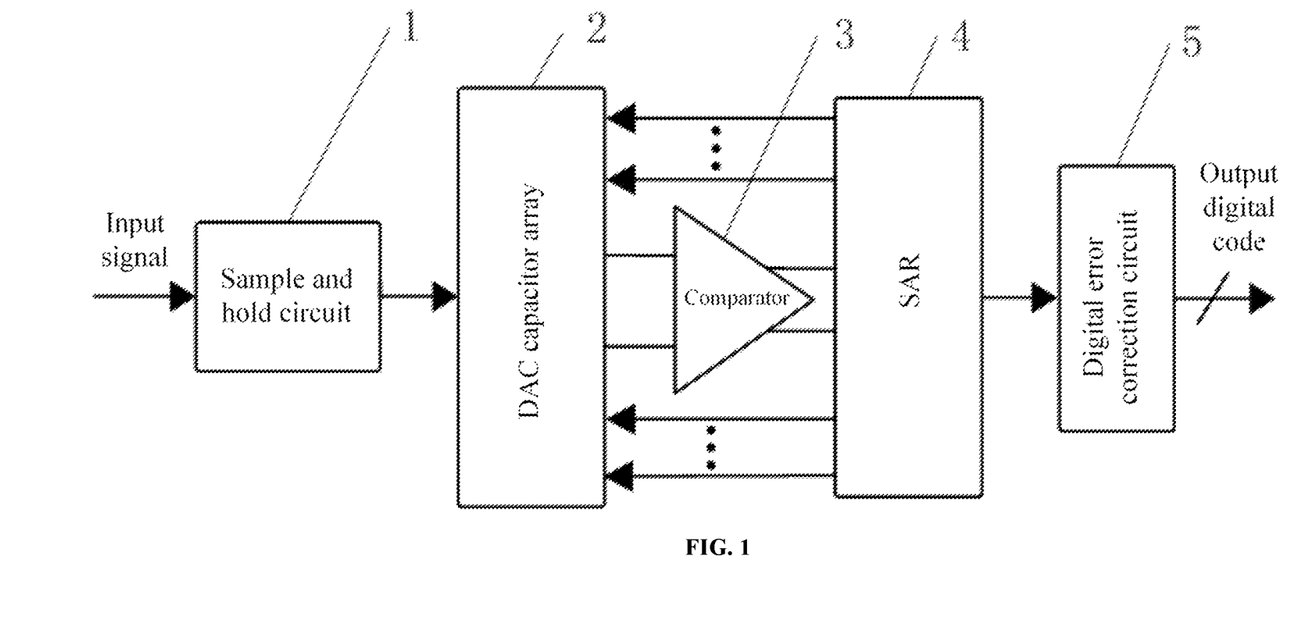
FIG. 1 is an overall architectural diagram of an ADC according to Embodiment 1 of the present disclosure.

In this embodiment, a high-speed and low-power SAR ADC is provided, which has a fully differential structure. As shown in FIG. 1, the ADC includes a sample and hold circuit 1, a binarization circuit, and a digital error correction circuit 5.

The sample and hold circuit 1 is configured to sample input signals to obtain sampled signals.

The binarization circuit is connected to an output terminal of the sample and hold circuit 1. The binarization circuit includes a DAC capacitor array 2, a comparator 3, and a SAR 4. Input terminals of the DAC capacitor array 2 are connected to the sample and hold circuit 1 and the SAR 4. The DAC capacitor array 2 is configured to quantize the sampled signals based on a control signal generated by the SAR 4 to obtain quantized voltages. An input terminal of the comparator 3 is connected to the DAC capacitor array 2. The comparator 3 is configured to compare the quantized voltages to generate a comparison result. An input terminal of the SAR 4 is connected to the comparator 3. The SAR 4 is configured to generate the control signal based on the comparison result and output an initial binary code based on all comparison results.

Figure 2:
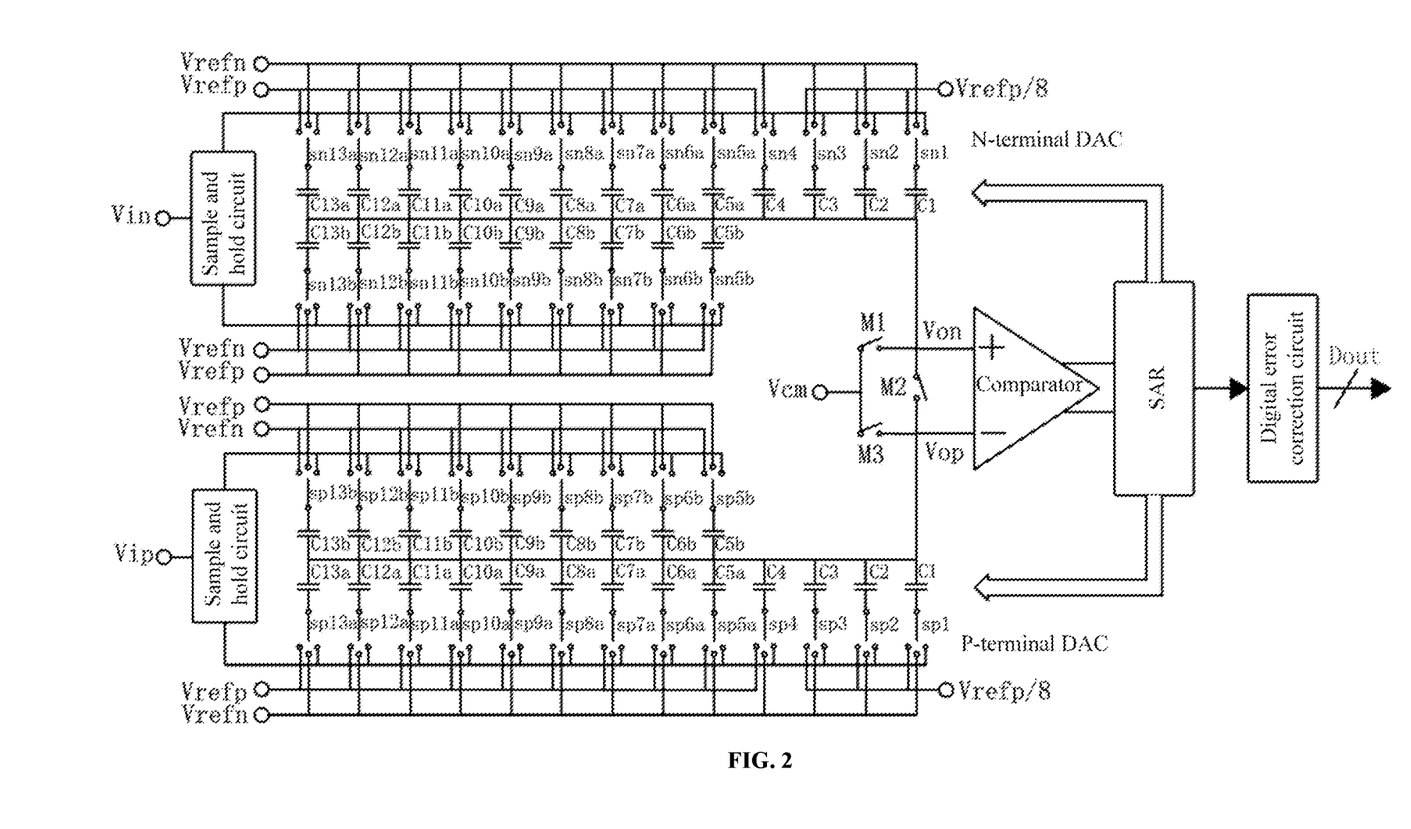
FIG. 2 is a circuit diagram of an ADC according to Embodiment 1 of the present disclosure.

Specifically, as shown in FIG. 2, the sample and hold circuit 1 includes a first sample and hold circuit and a second sample and hold circuit. The first sample and hold circuit is configured to sample a first input signal Vin to obtain a first sampled signal, and the second sample and hold circuit is configured to sample a second input signal Vip to obtain a second sampled signal.

The DAC capacitor array 2 includes two capacitor sub-arrays with a same structure. The two capacitor sub-arrays constitute a differential circuit. The two capacitor sub-arrays are denoted as an N-terminal DAC capacitor sub-array and a P-terminal DAC capacitor sub-array. The N-terminal DAC capacitor sub-array includes a plurality of capacitors. A lower plate of each capacitor is selectively connected to a reference voltage, a ground, or the first sampled signal through a multiplexer switch. Upper plates of all the capacitors are connected to serve as an output terminal of the N-terminal DAC capacitor sub-array. The P-terminal DAC capacitor sub-array includes a plurality of capacitors. A lower plate of each capacitor is selectively connected to the reference voltage, the ground, or the second sampled signal through a multiplexer switch. Upper plates of all the capacitors are connected to serve as an output terminal of the P-terminal DAC capacitor sub-array. The N-terminal DAC capacitor sub-array has an input terminal connected to an output terminal of the first sample and hold circuit and the output terminal connected to an in-phase input terminal of the comparator 3. The N-terminal DAC capacitor sub-array is configured to quantize the first sampled signal based on the control signal generated by the SAR 4 to obtain a first quantized voltage Von. The P-terminal DAC capacitor sub-array has an input terminal connected to an output terminal of the second sample and hold circuit and the output terminal connected to an out-of-phase input terminal of the comparator 3. The P-terminal DAC capacitor sub-array is configured to quantize the second sampled signal based on the control signal generated by the SAR 4 to obtain a second quantized voltage Vop. The comparator 3 is configured to compare the first quantized voltage Von and the second quantized voltage Vop to obtain the comparison result. The SAR 4 is configured to generate the control signal based on the comparison result and output the initial binary code based on all comparison results.

In the prior art, the total number of capacitors included in each capacitor sub-array of the DAC capacitor array 2 is the same as the number of precision bits of the ADC. For example, if the number of precision bits of the ADC is 12, the total number of capacitors included in the capacitor sub-array is also 12. An equivalent weight of each capacitor increases exponentially, that is, based on a rule of 1, 2, 4, 8, 16, 32, 64, . . . , and $2^{11}$. In this embodiment, binary redundancy assembly is introduced such that the total number of capacitors included in each capacitor sub-array of the DAC capacitor array is greater than the number of precision bits of the ADC. The total number of unit capacitors included in all of the capacitors when the total number of capacitors included in the capacitor sub-array is greater than the number of precision bits of the ADC is equal to the total number of unit capacitors included in all of the capacitors when the total number of capacitors included in the capacitor sub-array is equal to the number of precision bits of the ADC (in the prior art). It can also be considered that the sum of the equivalent weights of all the capacitors in this embodiment is equal to the sum of the equivalent weights of all the capacitors in the prior art (when the total number of capacitors included in the capacitor sub-array is equal to the number of precision bits of the ADC). The DAC capacitor array 2 with the binary redundancy reassembly structure can introduce redundancy during the quantization and calibrate an error during the quantization without increasing the number of unit capacitors, to reduce overall quantization duration and improve quantization speed and precision.

In this embodiment, the binarization circuit is configured to binarize the sampled signals to obtain the initial binary code. Because the binary redundancy reassembly is introduced, the number of bits of the initial binary code is equal to the total number of capacitors included in the capacitor sub-array, but is greater than the number of precision bits of the ADC. Based on this, the digital error correction circuit 5 is further provided in this embodiment. The digital error correction circuit 5 is connected to an output terminal of the binarization circuit, and specifically, connected to an output terminal of the SAR 4. The digital error correction circuit 5 is configured to convert the initial binary code output after a plurality of comparisons to obtain a binary code. The number of bits of the binary code is equal to the number of precision bits of the ADC.

In an optional implementation, the following improvements may be made to the capacitor sub-array in this embodiment:

(1) All of the capacitors in the capacitor sub-array are sorted in ascending order of charge amounts of the capacitors. The first W capacitors form a first capacitor group, and the other capacitors form a second capacitor group. A reference voltage corresponding to the capacitors in the first capacitor group is denoted as a first reference voltage, and a reference voltage corresponding to the capacitors in the second capacitor group is denoted as a second reference voltage. The second reference voltage is M times greater than the first reference voltage. M is 2 to the power of m, and m is a positive integer greater than or equal to 1. In the foregoing design, the capacitor sub-array can be optimized through two reference levels. The DAC capacitor array 2 with a structure of two reference levels can significantly reduce the number of unit capacitors and the power consumption and area of the circuit.

In this embodiment, W may be 3. In other words, the first 3 capacitors form the first capacitor group, and the other capacitors form the second capacitor group. M is a common multiple of the total number of unit capacitors included in the second capacitor group. In this way, the number of unit capacitors included in each capacitor is not a decimal. This ensures that the number of unit capacitors included in each capacitor is a positive integer. Preferably, M is 8. In this case, the first reference voltage is $$\frac{Vrefp}{8},$$

and the second reference voltage is Vrefp. In other words, the two reference levels used by the DAC capacitor array 2 are Vrefp and ⅛Vrefp.

(2) All of the capacitors in the capacitor sub-array are sorted in ascending order of the charge amounts of the capacitors. The last Q capacitors each include two sub-capacitors. The two sub-capacitors include a same number of unit capacitors. Upper plates of the two sub-capacitors are connected, and lower plates of the two sub-capacitors each are selectively connected to the reference voltage, the ground, or the sampled signal through the multiplexer switch. In this embodiment, a capacitor sorted later has a larger number of bits. The DAC capacitor array 2 with a high-order capacitor splitting structure can reduce the change in a common-mode voltage of the plate of the DAC capacitor and the large change in an offset voltage of the comparator 3.

This embodiment provides the high-speed and low-power SAR ADC, including the sample and hold circuit 1, the DAC capacitor array 2, the comparator 3, the SAR 4, and the digital error correction circuit 5. The DAC capacitor array 2 of the ADC is optimized by using the following three methods: (1) binary redundancy reassembly; (2) two reference levels; and (3) high-order capacitor splitting. The DAC capacitor array 2 with the binary redundancy reassembly structure can introduce redundancy during the quantization and calibrate the error during the quantization without increasing the number of unit capacitors. This reduces the overall quantization duration and improves the quantization speed and precision. The DAC capacitor array 2 with the structure of two reference levels can significantly reduce the number of unit capacitors and the power consumption and area of the circuit. The DAC capacitor array 2 with the high-order capacitor splitting structure can reduce the change in the common-mode voltage of the plate of the DAC capacitor and the large change in the offset voltage of the comparator 3. Therefore, the DAC capacitor array 2 with binary redundancy reassembly, two reference levels, and high-order capacitor splitting can significantly improve a conversion rate and the number of effective bits of the ADC, reduce the overall power consumption and area of the circuit, and improve economic benefits.

As shown in FIG. 2, when the resolution of the ADC is 12 bits, redundancy reassembly is performed on a 12-bit binary code of the DAC capacitor array 2 to obtain a 13-bit initial binary code. A single-terminal DAC capacitor sub-array of the differential circuit includes 13 capacitors in total. Equivalent weights of the capacitors may be 1920, 1024, 512, 288, 160, 80, 48, 32, 16, 8, 4, 2, and 1 in descending order. The binary redundancy reassembly splits the capacitor at the most significant bit of the traditional binary capacitor array, superimposes the split capacitor on the capacitor at a low-order bit, and adds a redundancy bit. C13 to C4 are connected to a second reference level Vrefp, and C3 to C1 are connected to a first reference level ⅛Vrefp. Vrefp is a power supply voltage, and Vrefn is the ground. When the equivalent weight of each capacitor is constant and the two reference levels are Vrefp and ⅛Vrefp, if the actual capacitance weights of C13 to C4 (namely, the capacitors in the second capacitor group) are reduced to ⅛ of the original weights, actual capacitances of C13 to C1 at the two reference levels are 240C, 128C, 64C, 36C, 20C, 10C, 6C, 4C, 2C, 1C, 4C, 2C, and 1C. The number before C represents the number of unit capacitors included in each capacitor. The capacitors C13 to C5 at the 9 high-order bits are split equally, that is, Ci=2Cia=2Cib.

Further, refer to Table 1. Table 1 shows the stride voltage, capacitance, equivalent weight p, and redundancy q of the DAC capacitor array in this embodiment of the present disclosure.

TABLE 1

| | Stride voltage s | Capacitance weight w | Equivalent weight p | Redundancy q | Precision |
|---|---|---|---|---|---|
| 1 | 240 | 240 | 1920 | 32 | 16 |
| 2 | 128 | 128 | 1024 | 16 | 8 |
| 3 | 64 | 64 | 512 | 16 | 8 |
| 4 | 36 | 36 | 288 | 8 | 4 |
| 5 | 20 | 20 | 160 | 4 | 2 |
| 6 | 10 | 10 | 80 | 4 | 2 |
| 7 | 6 | 6 | 48 | 2 | 1 |
| 8 | 4 | 4 | 32 | 0 | 0.5 |
| 9 | 2 | 2 | 16 | 0 | 0.5 |
| 10 | 1 | 1 | 8 | 0 | 0.5 |
| 11 | 0.5 | 4 | 4 | 0 | 0.5 |
| 12 | 0.25 | 2 | 2 | 0 | 0.5 |
| 13 | 0.125 | 1 | 1 | 0 | 0.5 |

Figure 3:
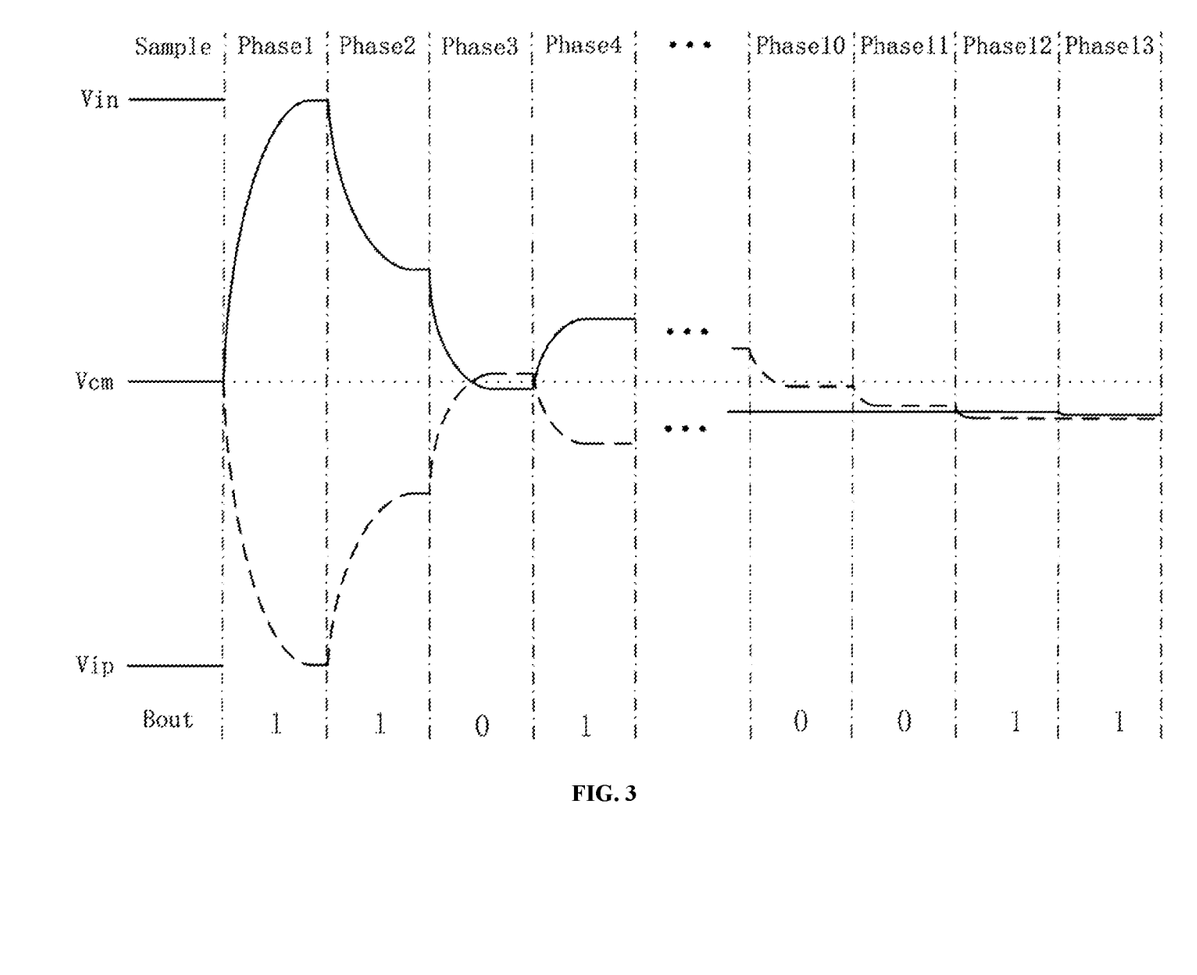
FIG. 3 is a working sequence diagram of an ADC according to Embodiment 1 of the present disclosure.

Based on the foregoing three improvements made to the DAC capacitor array 2, when each capacitor sub-array includes 13 capacitors, 13 comparisons need to be performed on the sampled signals to obtain the 13-bit initial binary code. As shown in FIG. 3, the conversion process includes the following steps:

Step 1 is a sampling stage. During sampling, switches M1, M2, and M3 of a common-mode voltage Vcm and a sampling switch are closed in sequence under the drive of a sampling clock. The lower plates of C13 to C1 start sampling. In this case, the upper plates of C13 to C1 are firstly connected to the common-mode voltage Vcm, and the lower plates of the two capacitor sub-arrays of the differential circuit are respectively connected to the input signals Vin and Vip. During resetting, the switches M1, M2, and M3 of the common-mode voltage Vcm and the sampling switch are opened in sequence under the drive of the sampling clock. The lower plates of C13a to C5a, C4, C3, C2, and C1 are connected to Vrefn, and the lower plates of C13b to C5b are connected to Vrefp to finish sampling the input signals.

Step 2 is a quantization stage. After the sampling is completed, a comparison starts under the drive of the SAR 4. The single-terminal DAC of the differential circuit is used as an example. During first quantization, the lower plates of all capacitors C12a to C5a, C4, C3, C2, and C1 of the N-terminal DAC capacitor sub-array except the capacitor at most significant bit are connected to Vrefn, and the lower plates of C12b to C5b are connected to Vrefp. The stride voltage of the upper plate of the DAC capacitor is increased by Vrefp×$w_{13}$ (the capacitance weight of C13) through such capacitor switching. The comparator 3 starts to compare the voltage Von input into the in-phase input terminal and the voltage Vop input into the out-of-phase input terminal after the establishment of the DAC is completed, and outputs the comparison result after the comparison is completed. A control circuit controls the capacitor at the second most significant bit based on the comparison result. If Von>Vop, the control circuit sets the output code at the most significant bit to 1. If Von<Vop, the control circuit sets the output code at the most significant bit to 0. During second quantization, a switched capacitor network performs charge redistribution. After the re-establishment of the DAC is completed, the voltage Von input into the in-phase input terminal and the voltage Vop input into the out-of-phase input terminal are compared. After the comparison is completed, a comparison result is output to control the capacitor at the next bit. The output code at the second most significant bit is set to 0 or 1 based on the comparison result. The comparison is continued until the output code at the least significant bit is output after the comparison for the least significant bit is completed, resulting in the 13-bit initial binary code, which is written to the SAR.

Specifically, the comparator performs the first quantization based on the comparison result of phase 1. After the sampling is completed, the comparator 3 splits the capacitor and performs resetting. The comparator compares the voltage Von input into the in-phase input terminal and the voltage Vop input into the out-of-phase input terminal for the first time. If Von>Vop, the control circuit sets the output code to 1. During the first quantization, the lower plates of the N-terminal DAC capacitors C13b, C12a to C5a, and C4 are connected to Vrefn, and the lower plates of C13a and C12b to C5b are connected to Vrefp; and the lower plates of the P-terminal DAC capacitors C13b, C12a to C5a, and C4 are connected to Vrefp, and the lower plates of C13a and C12b to C5b are connected to Vrefn. The comparator 3 starts comparing the voltage Von input into the in-phase input terminal and the voltage Vop input into the out-of-phase input terminal after the establishment of the DAC is completed. If Von>Vop, the control circuit sets the output code to 1.

During the second quantization, the switch sn12b corresponding to the lower plate of the N-terminal DAC capacitor C12b is connected to Vrefn, and the switch sn12a corresponding to the lower plate of C12a is connected to Vrefp; and the switch sp12b corresponding to the lower plate of the P-terminal DAC capacitor C12b is connected to Vrefp, and the switch sp12a corresponding to the lower plate of the C12a is connected to Vrefn. The comparator 3 starts comparing the voltage Von input into the in-phase input terminal and the voltage Vop input into the out-of-phase input terminal after the establishment of the DAC is completed. If Von<Vop, the control circuit sets the output code to 0.

During the third quantization, the switch sn11b corresponding to the lower plate of the N-terminal DAC capacitor C11b is connected to Vrefp, and the switch s11a corresponding to the lower plate of C11a is connected to Vrefn; and the switch sp11b corresponding to the lower plate of the P-terminal DAC capacitor C11b is connected to Vrefn, and the switch sp11a corresponding to the lower plate of the C11a is connected to Vrefp. The comparator 3 starts comparing the voltage Von input into the in-phase input terminal and the voltage Vop input into the out-of-phase input terminal after the establishment of the DAC is completed. If Von>Vop, the control circuit sets the output code to 1.

During the fourth quantization, the switch sn10b corresponding to the lower plate of the N-terminal DAC capacitor C10b is connected to Vrefn, and the switch sn10a corresponding to the lower plate of the C10a is connected to the Vrefp; and the switch sp10b corresponding to the lower plate of the P-terminal DAC capacitor C10b is connected to Vrefp, and the switch sp10a corresponding to the lower plate of the C10a is connected to Vrefn. The comparator 3 starts comparing the voltage Von input into the in-phase input terminal and the voltage Vop input into the out-of-phase input terminal after the establishment of the DAC is completed. If Von>Vop, the control circuit sets the output code to 1.

Because the capacitors at the 9 high-order bits of the DAC capacitor array 2 have an equivalent split structure, the common-mode voltage is constant during the first to ninth quantization.

During the tenth quantization, the switch sn4 corresponding to the lower plate of the N-terminal DAC capacitor C4 is connected to Vrefp; and the switch sp4 corresponding to the lower plate of the P-terminal DAC capacitor C4 is connected to Vrefn. The comparator 3 starts comparing the voltage Von input into the in-phase input terminal and the voltage Vop input into the out-of-phase input terminal after the establishment of the DAC is completed. If Von<Vop, the control circuit sets the output code to 0.

During the eleventh quantization, the switch sn3 corresponding to the lower plate of the N-terminal DAC capacitor C3 is connected to ⅛Vrefp; and the switch sp3 corresponding to the lower plate of the P-terminal DAC capacitor C3 is connected to Vrefn. The comparator 3 starts comparing the voltage Von input into the in-phase input terminal and the voltage Vop input into the out-of-phase input terminal after the establishment of the DAC is completed. If Von>Vop, the control circuit sets the output code to 1.

During the twelfth quantization, the switch sn2 corresponding to the lower plate of the N-terminal DAC capacitor C2 is connected to Vrefn; and the switch sp2 corresponding to the lower plate of the P-terminal DAC capacitor C2 is connected to ⅛Vrefp. The comparator 3 starts comparing the voltage Von input into the in-phase input terminal and the voltage Vop input into the out-of-phase input terminal after the establishment of the DAC is completed. If Von>Vop, the control circuit sets the output code to 1.

During the thirteenth quantization, the switch sn1 corresponding to the lower plate of the N-terminal DAC capacitor C1 is connected to ⅛Vrefp; and the switch sp1 corresponding to the lower plate of the P-terminal DAC capacitor C1 is connected to Vrefn. The comparator 3 starts comparing the voltage Von input into the in-phase input terminal and the voltage Vop input into the out-of-phase input terminal after the establishment of the DAC is completed. If Von>Vop, the control circuit sets the output code to 1.

Because the capacitors at the 4 low-order bits of the DAC capacitor array 2 have a monotone switching structure, and both Vin and Vip can only be reduced, the common-mode voltage of the upper plate of the DAC capacitor array 2 decreases accordingly. However, only the capacitors at the 4 low-order bits have this structure. Therefore, the common-mode voltage of the upper plate of the DAC capacitor array 2 does not change greatly. The stride voltages of the capacitors at the 4 low-order bits are 8LSB, 4LSB, 2LSB, and 1LSB. The common-mode voltage of the upper plate of the DAC capacitor array 2 is only 15LSB/2. For the 12-bit SAR ADC, such a slight change in the common-mode voltage does not cause a large change in the offset voltage of the comparator 3.

Step 3 is a decoding stage. The digital error correction circuit 5 converts the 13-bit initial binary code into a 12-bit binary code by performing addition with carry through a full adder to complete analog-to-digital conversion.

Figure 4:
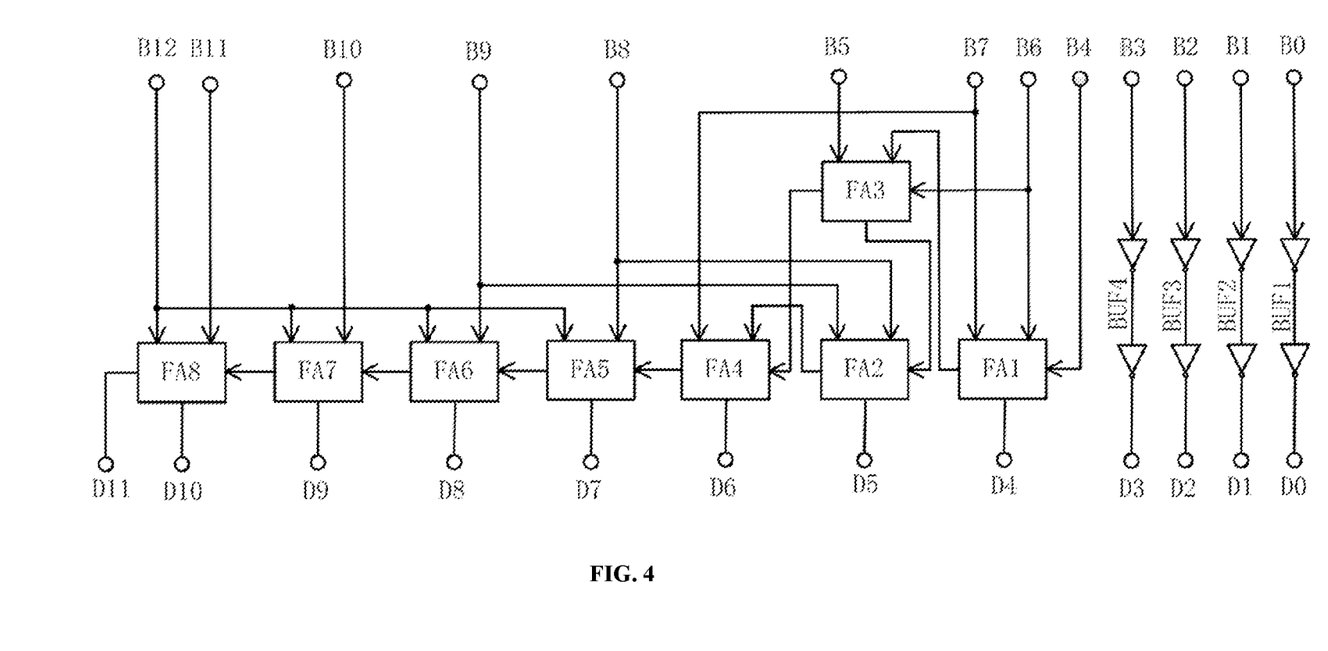
FIG. 4 is a schematic structural diagram of a digital error correction circuit of an ADC according to Embodiment 1 of the present disclosure.

As shown in FIG. 4, when the number of precision bits of the ADC is 12 and the total number of capacitors included in the capacitor sub-array is 13, the digital error correction circuit 5 may include a first buffer BUF1, a second buffer BUF2, a third buffer BUF3, a fourth buffer BUF4, a first full adder FA1, a second full adder FA2, a third full adder FA3, a fourth full adder FA4, a fifth full adder FA5, a sixth full adder FA6, a seventh full adder FA7, and an eighth full adder FA8. The eight full adders are connected to each other. A carry terminal of the first full adder FA1 is connected to an input terminal of the third full adder FA3. A carry terminal of the third full adder FA3 is connected to an input terminal of the fourth full adder FA4. An output terminal of the third full adder FA3 is connected to an input terminal of the second full adder FA2. A carry terminal of the second full adder FA2 is connected to the input terminal of the fourth full adder FA4. A carry terminal of the fourth full adder FA4 is connected to an input terminal of the fifth full adder FA5. A carry terminal of the fifth full adder FA5 is connected to an input terminal of the sixth full adder FA6. A carry terminal of the sixth full adder FA6 is connected to an input terminal of the seventh full adder FA7. A carry terminal of the seventh full adder FA7 is connected to an input terminal of the eighth full adder FA8.

The first buffer BUF1 has an input terminal connected to a first initial binary code B0 and an output terminal outputting a first binary code D0.

The second buffer BUF2 has an input terminal connected to a second initial binary code B1 and an output terminal outputting a second binary code D1.

The third buffer BUF3 has an input terminal connected to a third initial binary code B2 and an output terminal outputting a third binary code D2.

The fourth buffer BUF4 has an input terminal connected to a fourth initial binary code B3 and an output terminal outputting a fourth binary code D3.

The first buffer BUF1, the second buffer BUF2, the third buffer BUF3, and the fourth buffer BUF4 each are composed of an even number of phase inverters connected in series. Input and output of the buffers BUF1, BUF2, BUF3, and BUF4 are the same. The buffers do not have an encoding function, and mainly play the role of coordination and buffering to synchronize data transmission.

The first full adder FA1 has an input terminal connected to a fifth initial binary code B4, a seventh initial binary code B6, and an eighth initial binary code B7, and an output terminal outputting a fifth binary code D4.

The input terminal of the third full adder FA3 is connected to a sixth initial binary code B5, the seventh initial binary code B6, and the carry terminal of the first full adder FA1.

The second full adder FA2 has the input terminal connected to a ninth initial binary code B8, a tenth initial binary code B9, and the output terminal of the third full adder FA3, and an output terminal outputting a sixth binary code D5.

The fourth full adder FA4 has the input terminal connected to the eighth initial binary code B7, the carry terminal of the second full adder FA2, and the carry terminal of the third full adder FA3, and an output terminal outputting a seventh binary code D6.

The fifth full adder FA5 has the input terminal connected to the ninth initial binary code B8, a thirteenth initial binary code B12, and the carry terminal of the fourth full adder FA4, and an output terminal outputting an eighth binary code D7.

The sixth full adder FA6 has the input terminal connected to the tenth initial binary code B9, the thirteenth initial binary code B12, and the carry terminal of the fifth full adder FA5, and an output terminal outputting a ninth binary code D8.

The seventh full adder FA7 has the input terminal connected to an eleventh initial binary code B10, the thirteenth initial binary code B12, and the carry terminal of the sixth full adder FA6, and an output terminal outputting a tenth binary code D9.

The eighth full adder FA8 has the input terminal connected to a twelfth initial binary code B11, the thirteenth initial binary code B12, and the carry terminal of the seventh full adder FA7, an output terminal outputting an eleventh binary code D10, and a carry terminal outputting a twelfth binary code D11.

Figure 5:
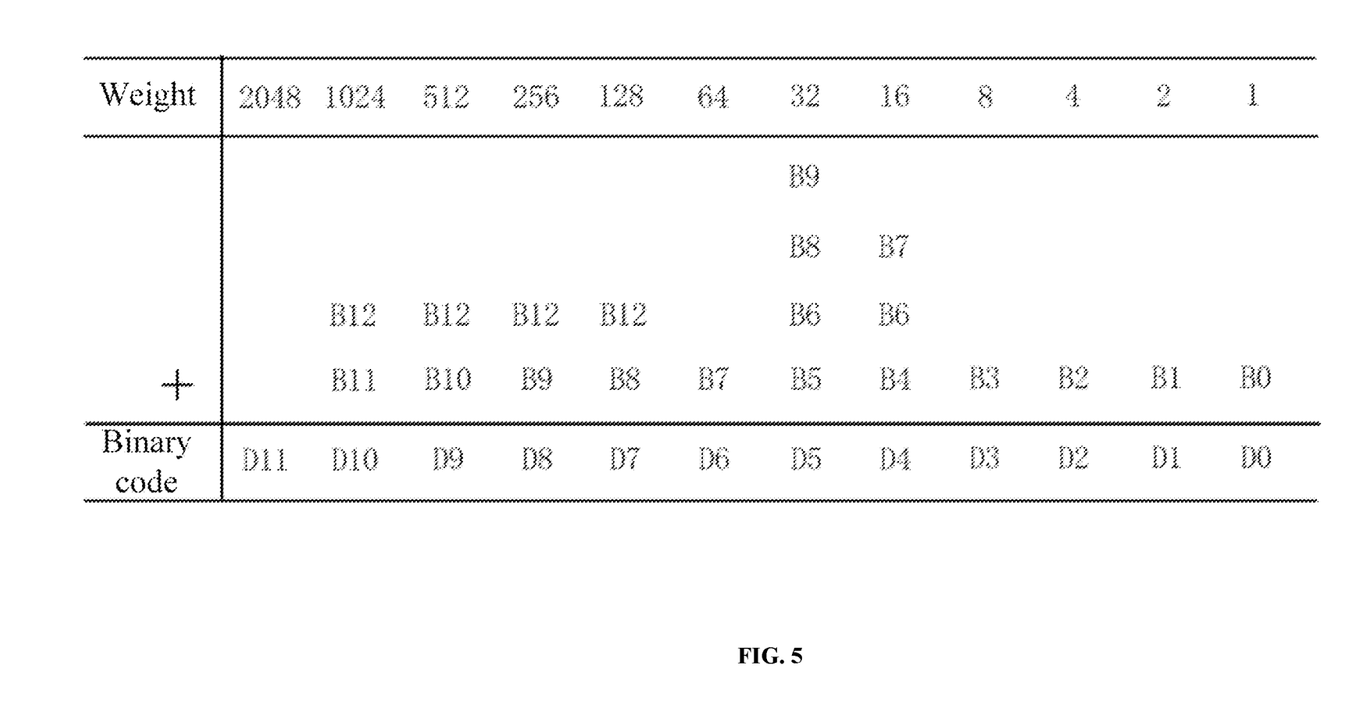
FIG. 5 is a schematic diagram of a calculation process of a digital error correction circuit of an ADC according to Embodiment 1 of the present disclosure.

As shown in FIG. 5, in this embodiment, the digital error correction circuit 5 converts the 13-bit initial binary code into the 12-bit binary code based on an equivalent weight relationship of the 13-bit binary code obtained after redundancy reassembly at the two reference levels.

The DAC capacitor array 2 of the SAR ADC in this embodiment is optimized by using the following methods: binary redundancy reassembly, two reference levels, and high-order capacitor splitting. The binary redundancy reassembly splits the capacitor at the most significant bit of the traditional binary capacitor array, superimposes the split capacitor on the capacitor at the low-order bit, and adds the redundancy bit. The DAC capacitor array 2 with the binary redundancy reassembly structure can introduce the redundancy during the quantization to reduce the overall quantization duration and improve the quantization speed. The binary redundancy reassembly structure can also calibrate the error during the quantization through the redundancy to improve the quantization precision. The two reference levels are Vrefp and ⅛Vrefp. When the equivalent weight Vrefp×wi (the capacitance weight of Ci) is constant, if the capacitor connected to the reference level ⅛Vrefp is a unit capacitor C, the unit capacitor connected to the reference level Vrefp is ⅛C. The multiple relationship of the two reference levels is considered when the circuit is designed. Redundancy reassembly is performed on the unit capacitor connected to Vrefp to implement a multiple of 8. This ensures that the capacitors used by the DAC capacitor array 2 are all unit capacitors. The DAC capacitor array 2 with the structure of two reference levels can significantly reduce the number of unit capacitors and the power consumption and area of the circuit. The DAC capacitor array 2 with the high-order capacitor splitting structure can achieve a slight change in the common-mode voltage of the plate of the DAC capacitor. The slight change in the common-mode voltage does not cause a large change in the offset voltage of the comparator 3. The DAC capacitor array 2 with binary redundancy reassembly, two reference levels, and high-order capacitor splitting can significantly improve the conversion rate and precision of the ADC, and reduce the power consumption and area of the circuit.

Embodiment 2

In this embodiment, an analog-to-digital conversion method based on the high-speed and low-power SAR ADC in Embodiment 1 is provided. The analog-to-digital conversion method includes:

Use a sample and hold circuit to sample an input signal to obtain a sampled signal.

Use a binarization circuit to binarize the sampled signal to output an initial binary code, where the number of bits of the initial binary code is equal to the total number of capacitors included in a capacitor sub-array.

Use a digital error correction circuit to convert the initial binary code to obtain a binary code, where the number of bits of the binary code is equal to the number of precision bits of the SAR ADC.

In this embodiment, the DAC capacitor array is improved. The redundancy can be introduced during the quantization by using the binary redundancy reassembly structure. This reduces the overall quantization duration and improves the quantization speed. The error during the quantization can also be calibrated through the redundancy by using the binary redundancy reassembly structure. This improves the quantization precision. The structure of two reference levels can significantly reduce the number of unit capacitors and reduce the power consumption and area of the circuit. The high-order capacitor splitting structure can achieve a slight change in the common-mode voltage of the plate of the DAC capacitor and reduce the change in the offset voltage of the comparator. The DAC capacitor array 2 with binary redundancy reassembly, two reference levels, and high-order capacitor splitting can significantly improve the conversion rate and precision of the ADC, and reduce the power consumption and area of the circuit.

Each embodiment of this specification is described in a progressive manner, each embodiment focuses on the difference from other embodiments, and the same and similar parts between the embodiments may refer to each other.

In this specification, some specific embodiments are used for illustration of the principles and implementations of the present disclosure. The description of the foregoing embodiments is used to help illustrate the method of the present disclosure and the core ideas thereof. In addition, persons of ordinary skill in the art can make various modifications in terms of specific implementations and the scope of application in accordance with the ideas of the present disclosure. In conclusion, the content of this specification shall not be construed as limitations to the present disclosure.

What is claimed is:

1. A high-speed and low-power successive approximation register analog-to-digital converter (SAR ADC), comprising a sample and hold circuit, a binarization circuit, and a digital error correction circuit; wherein the sample and hold circuit is configured to sample an input signal to obtain a sampled signal;

the binarization circuit is connected to an output terminal of the sample and hold circuit; the binarization circuit comprises a digital-to-analog converter (DAC) capacitor array, the DAC capacitor array comprises two capacitor sub-arrays with a same structure, the capacitor sub-arrays each comprise a plurality of capacitors, a lower plate of each of the capacitors is selectively connected to a reference voltage, a ground, or the sampled signal through a multiplexer switch, and upper plates of all of the capacitors are connected to serve as an output terminal of the capacitor sub-array; and the total number of capacitors comprised in the capacitor sub-array is greater than the number of precision bits of the SAR ADC, and the total number of unit capacitors comprised in all of the capacitors when the total number of capacitors comprised in the capacitor sub-array is greater than the number of precision bits of the SAR ADC is equal to the total number of unit capacitors comprised in all of the capacitors when the total number of capacitors comprised in the capacitor sub-array is equal to the number of precision bits of the SAR ADC;

the binarization circuit is configured to binarize the sampled signal to obtain an initial binary code; and a number of bits of the initial binary code is equal to the total number of capacitors comprised in the capacitor sub-array; and the digital error correction circuit is connected to an output terminal of the binarization circuit; the digital error correction circuit is configured to convert the initial binary code to obtain a binary code; and a number of bits of the binary code is equal to the number of precision bits of the SAR ADC.

2. The SAR ADC according to claim 1, wherein all of the capacitors in the capacitor sub-array are sorted in ascending order of charge amounts of the capacitors; and the first W capacitors form a first capacitor group, and the other capacitors form a second capacitor group; a reference voltage corresponding to the capacitors in the first capacitor group is denoted as a first reference voltage, a reference voltage corresponding to the capacitors in the second capacitor group is denoted as a second reference voltage, and the second reference voltage is M times greater than the first reference voltage; and M is 2 to the power of m, and m is a positive integer greater than or equal to 1.

3. The SAR ADC according to claim 1, wherein all of the capacitors in the capacitor sub-array are sorted in ascending order of charge amounts of the capacitors; and the last Q capacitors each comprise two sub-capacitors, the two sub-capacitors comprise a same number of unit capacitors, upper plates of the two sub-capacitors are connected, and lower plates of the two sub-capacitors each are selectively connected to the reference voltage, the ground, or the sampled signal through the multiplexer switch.

4. The SAR ADC according to claim 1, wherein when the number of precision bits of the SAR ADC is 12, the total number of capacitors comprised in the capacitor sub-array is 13.

5. The SAR ADC according to claim 2, wherein the first reference voltage is $$\frac{Vrefp}{8},$$

and the second reference voltage is Vrefp.

6. The SAR ADC according to claim 2, wherein W is 3; and M is a common multiple of the total number of unit capacitors comprised in the second capacitor group.

7. The SAR ADC according to claim 1, wherein the binarization circuit further comprises a comparator and a SAR;

the sample and hold circuit comprises a first sample and hold circuit and a second sample and hold circuit; the first sample and hold circuit is configured to sample a first input signal Vin to obtain a first sampled signal; and the second sample and hold circuit is configured to sample a second input signal Vip to obtain a second sampled signal;

the two capacitor sub-arrays are denoted as an N-terminal DAC capacitor sub-array and a P-terminal DAC capacitor sub-array; the N-terminal DAC capacitor sub-array has an input terminal connected to an output terminal of the first sample and hold circuit and an output terminal connected to an in-phase input terminal of the comparator; the N-terminal DAC capacitor sub-array is configured to quantize the first sampled signal based on a control signal generated by the SAR to obtain a first quantized voltage; the P-terminal DAC capacitor sub-array has an input terminal connected to an output terminal of the second sample and hold circuit and an output terminal connected to an out-of-phase input terminal of the comparator; and the P-terminal DAC capacitor sub-array is configured to quantize the second sampled signal based on the control signal to obtain a second quantized voltage;

the comparator is configured to compare the first quantized voltage and the second quantized voltage to obtain a comparison result; and the SAR is connected to an output terminal of the comparator; and the SAR is configured to generate the control signal based on the comparison result and output the initial binary code based on all comparison results.

8. The SAR ADC according to claim 1, wherein when the number of precision bits of the SAR ADC is 12 and the total number of capacitors comprised in the capacitor sub-array is 13, the digital error correction circuit comprises a first buffer BUF1, a second buffer BUF2, a third buffer BUF3, a fourth buffer BUF4, a first full adder FA1, a second full adder FA2, a third full adder FA3, a fourth full adder FA4, a fifth full adder FA5, a sixth full adder FA6, a seventh full adder FA7, and an eighth full adder FA8;

the first buffer BUF1 has an input terminal connected to a first initial binary code B0 and an output terminal outputting a first binary code D0;

the second buffer BUF2 has an input terminal connected to a second initial binary code B1 and an output terminal outputting a second binary code D1;

the third buffer BUF3 has an input terminal connected to a third initial binary code B2 and an output terminal outputting a third binary code D2;

the fourth buffer BUF4 has an input terminal connected to a fourth initial binary code B3 and an output terminal outputting a fourth binary code D3;

the first full adder FA1 has an input terminal connected to a fifth initial binary code B4, a seventh initial binary code B6, and an eighth initial binary code B7, and an output terminal outputting a fifth binary code D4;

the third full adder FA3 has an input terminal connected to a sixth initial binary code B5, the seventh initial binary code B6, and a carry terminal of the first full adder FA1;

the second full adder FA2 has an input terminal connected to a ninth initial binary code B8, a tenth initial binary code B9, and the output terminal of the third full adder FA3, and an output terminal outputting a sixth binary code D5;

the fourth full adder FA4 has an input terminal connected to the eighth initial binary code B7, a carry terminal of the second full adder FA2, and a carry terminal of the third full adder FA3, and an output terminal outputting a seventh binary code D6;

the fifth full adder FA5 has an input terminal connected to the ninth initial binary code B8, a thirteenth initial binary code B12, and a carry terminal of the fourth full adder FA4, and an output terminal outputting an eighth binary code D7;

the sixth full adder FA6 has an input terminal connected to the tenth initial binary code B9, the thirteenth initial binary code B12, and a carry terminal of the fifth full adder FA5, and an output terminal outputting a ninth binary code D8;

the seventh full adder FA7 has an input terminal connected to an eleventh initial binary code B10, the thirteenth initial binary code B12, and a carry terminal of the sixth full adder FA6, and an output terminal outputting a tenth binary code D9; and the eighth full adder FA8 has an input terminal connected to a twelfth initial binary code B11, the thirteenth initial binary code B12, and a carry terminal of the seventh full adder FA7, an output terminal outputting an eleventh binary code D10, and a carry terminal outputting a twelfth binary code D11.

9. The SAR ADC according to claim 8, wherein the first buffer BUF1, the second buffer BUF2, the third buffer BUF3, and the fourth buffer BUF4 each are composed of an even number of phase inverters connected in series.

10. An analog-to-digital conversion method based on the high-speed and low-power SAR ADC according to claim 1, comprising:

using the sample and hold circuit to sample the input signal to obtain the sampled signal;

using the binarization circuit to binarize the sampled signal to output the initial binary code, wherein the number of bits of the initial binary code is equal to the total number of capacitors comprised in the capacitor sub-array; and using the digital error correction circuit to convert the initial binary code to obtain the binary code, wherein the number of bits of the binary code is equal to the number of precision bits of the SAR ADC.

11. The analog-to-digital conversion method according to claim 10, wherein all of the capacitors in the capacitor sub-array are sorted in ascending order of charge amounts of the capacitors; and the first W capacitors form a first capacitor group, and the other capacitors form a second capacitor group; a reference voltage corresponding to the capacitors in the first capacitor group is denoted as a first reference voltage, a reference voltage corresponding to the capacitors in the second capacitor group is denoted as a second reference voltage, and the second reference voltage is M times greater than the first reference voltage; and M is 2 to the power of m, and m is a positive integer greater than or equal to 1.

12. The analog-to-digital conversion method according to claim 10, wherein all of the capacitors in the capacitor sub-array are sorted in ascending order of charge amounts of the capacitors; and the last Q capacitors each comprise two sub-capacitors, the two sub-capacitors comprise a same number of unit capacitors, upper plates of the two sub-capacitors are connected, and lower plates of the two sub-capacitors each are selectively connected to the reference voltage, the ground, or the sampled signal through the multiplexer switch.

13. The analog-to-digital conversion method according to claim 10, wherein when the number of precision bits of the SAR ADC is 12, the total number of capacitors comprised in the capacitor sub-array is 13.

14. The analog-to-digital conversion method according to claim 11, wherein the first reference voltage is $$\frac{\mathrm{V}refp}{8},$$

and the second reference voltage is Vrefp.

15. The analog-to-digital conversion method according to claim 11, wherein W is 3; and M is a common multiple of the total number of unit capacitors comprised in the second capacitor group.

16. The analog-to-digital conversion method according to claim 10, wherein the binarization circuit further comprises a comparator and a SAR;

the sample and hold circuit comprises a first sample and hold circuit and a second sample and hold circuit; the first sample and hold circuit is configured to sample a first input signal Vin to obtain a first sampled signal; and the second sample and hold circuit is configured to sample a second input signal Vip to obtain a second sampled signal;

the two capacitor sub-arrays are denoted as an N-terminal DAC capacitor sub-array and a P-terminal DAC capacitor sub-array; the N-terminal DAC capacitor sub-array has an input terminal connected to an output terminal of the first sample and hold circuit and an output terminal connected to an in-phase input terminal of the comparator; the N-terminal DAC capacitor sub-array is configured to quantize the first sampled signal based on a control signal generated by the SAR to obtain a first quantized voltage; the P-terminal DAC capacitor sub-array has an input terminal connected to an output terminal of the second sample and hold circuit and an output terminal connected to an out-of-phase input terminal of the comparator; and the P-terminal DAC capacitor sub-array is configured to quantize the second sampled signal based on the control signal to obtain a second quantized voltage;

the comparator is configured to compare the first quantized voltage and the second quantized voltage to obtain a comparison result; and the SAR is connected to an output terminal of the comparator; and the SAR is configured to generate the control signal based on the comparison result and output the initial binary code based on all comparison results.

17. The analog-to-digital conversion method according to claim 10, wherein when the number of precision bits of the SAR ADC is 12 and the total number of capacitors comprised in the capacitor sub-array is 13, the digital error correction circuit comprises a first buffer BUF1, a second buffer BUF2, a third buffer BUF3, a fourth buffer BUF4, a first full adder FA1, a second full adder FA2, a third full adder FA3, a fourth full adder FA4, a fifth full adder FA5, a sixth full adder FA6, a seventh full adder FA7, and an eighth full adder FA8;

the first buffer BUF1 has an input terminal connected to a first initial binary code B0 and an output terminal outputting a first binary code D0;

the second buffer BUF2 has an input terminal connected to a second initial binary code B1 and an output terminal outputting a second binary code D1;

the third buffer BUF3 has an input terminal connected to a third initial binary code B2 and an output terminal outputting a third binary code D2;

the fourth buffer BUF4 has an input terminal connected to a fourth initial binary code B3 and an output terminal outputting a fourth binary code D3;

the first full adder FA1 has an input terminal connected to a fifth initial binary code B4, a seventh initial binary code B6, and an eighth initial binary code B7, and an output terminal outputting a fifth binary code D4;

the third full adder FA3 has an input terminal connected to a sixth initial binary code B5, the seventh initial binary code B6, and a carry terminal of the first full adder FA1;

the second full adder FA2 has an input terminal connected to a ninth initial binary code B8, a tenth initial binary code B9, and the output terminal of the third full adder FA3, and an output terminal outputting a sixth binary code D5;

the fourth full adder FA4 has an input terminal connected to the eighth initial binary code B7, a carry terminal of the second full adder FA2, and a carry terminal of the third full adder FA3, and an output terminal outputting a seventh binary code D6;

the fifth full adder FA5 has an input terminal connected to the ninth initial binary code B8, a thirteenth initial binary code B12, and a carry terminal of the fourth full adder FA4, and an output terminal outputting an eighth binary code D7;

the sixth full adder FA6 has an input terminal connected to the tenth initial binary code B9, the thirteenth initial binary code B12, and a carry terminal of the fifth full adder FA5, and an output terminal outputting a ninth binary code D8;

the seventh full adder FA7 has an input terminal connected to an eleventh initial binary code B10, the thirteenth initial binary code B12, and a carry terminal of the sixth full adder FA6, and an output terminal outputting a tenth binary code D9; and the eighth full adder FA8 has an input terminal connected to a twelfth initial binary code B11, the thirteenth initial binary code B12, and a carry terminal of the seventh full adder FA7, an output terminal outputting an eleventh binary code D10, and a carry terminal outputting a twelfth binary code D11.

18. The analog-to-digital conversion method according to claim 17, wherein the first buffer BUF1, the second buffer BUF2, the third buffer BUF3, and the fourth buffer BUF4 each are composed of an even number of phase inverters connected in series.

* * * * *